US010658739B2

(12) United States Patent
Mentovich et al.

(10) Patent No.: US 10,658,739 B2
(45) Date of Patent: May 19, 2020

(54) WIRELESS PRINTED CIRCUIT BOARD ASSEMBLY WITH INTEGRAL RADIO FREQUENCY WAVEGUIDE

(71) Applicant: Mellanox Technologies, Ltd., Yokneam (IL)

(72) Inventors: Elad Mentovich, Tel Aviv (IL); Yaakov Gridish, Yoqneam Ilit (IL); Oded Wertheim, Zichron Yaakov (IL); Sylvie Rockman, Zichron Yaakov (IL); Benny Koren, Zichron Yaakov (IL)

(73) Assignee: Mellanox Technologies, ltd., Yokneam (IL)

( * ) Notice: Subject to any disclaimer, the term of this patent is extended or adjusted under 35 U.S.C. 154(b) by 304 days.

(21) Appl. No.: 15/586,589

(22) Filed: May 4, 2017

(65) Prior Publication Data
US 2018/0323501 A1    Nov. 8, 2018

(51) Int. Cl.
| H01Q 1/38 | (2006.01) |
| H01Q 1/22 | (2006.01) |
| H01Q 13/02 | (2006.01) |
| H01P 3/12 | (2006.01) |
| H01P 5/12 | (2006.01) |
| H05K 1/18 | (2006.01) |

(Continued)

(52) U.S. Cl.
CPC ............... *H01Q 1/38* (2013.01); *H01P 3/121* (2013.01); *H01Q 1/2258* (2013.01); *H01Q 13/0283* (2013.01); *H01P 1/2088* (2013.01); *H01P 5/12* (2013.01); *H05K 1/0243* (2013.01); *H05K 1/181* (2013.01)

(58) Field of Classification Search
CPC .... H01L 2223/6627; H01P 3/121; H01P 3/08; H01P 5/107; H01P 5/024
See application file for complete search history.

(56) References Cited

U.S. PATENT DOCUMENTS 5,528,074 A * 6/1996 Goto ........................ H01L 23/66
257/664
2014/0240187 A1 * 8/2014 Herbsommer ............ H01P 3/16
343/785

(Continued)

OTHER PUBLICATIONS

Adhikari, Prasanna "Understanding Millimeter Wave Wireless Communication." Loea Corporation, San Diego, 2008, 7 pages.

*Primary Examiner* — Ricardo I Magallanes
(74) *Attorney, Agent, or Firm* — Alston & Bird LLP (57) ABSTRACT

An printed circuit board (PCB) assembly and method of assembling the same for a high-speed, short-reach communication link are described that provide a mechanism for transmitting radio frequency (RF) waves from one digital electronic component of the PCB assembly to another, where the second digital electronic component is located either on the same PCB assembly or on a second PCB assembly. The assembly includes a PCB having multiple layers and a digital electronic component supported by the PCB. At least one of the layers defines a channel that confines RF waves therein. An RF antenna in communication with the digital electronic component extends into the channel, and the RF antenna transmits RF signals generated by the digital electronic component into the channel as RF waves or receives RF waves via the channel and conveys corresponding RF signals to the digital electronic component.

18 Claims, 8 Drawing Sheets

(51) Int. Cl.
*H05K 1/02* (2006.01)
*H01P 1/208* (2006.01)

(56) References Cited

U.S. PATENT DOCUMENTS

| | | | |
|---|---|---|---|
| 2015/0295305 A1* | 10/2015 | Herbsommer | H01Q 19/108 |
| | | | 343/873 |
| 2016/0276727 A1* | 9/2016 | Dang | H01P 5/02 |
| 2018/0083333 A1* | 3/2018 | Wargo | H01P 3/087 |
| 2019/0013563 A1* | 1/2019 | Takeda | H01P 5/022 |
| 2019/0379334 A1* | 12/2019 | Krvavac | H03F 1/565 |

* cited by examiner

WIRELESS PRINTED CIRCUIT BOARD ASSEMBLY WITH INTEGRAL RADIO FREQUENCY WAVEGUIDE

BACKGROUND

The present disclosure relates in general to communication links for transmitting and receiving signals. In particular, wireless printed circuit board assemblies and methods of assembling wireless printed circuit board assemblies are described, where the printed circuit board assemblies have integral radio frequency waveguides for wirelessly propagating radio frequency waves, such as millimeter waves.

As technology progresses, the demand for higher bandwidth transmission of signals is ever increasing. Consequently, there is an ever growing need for improving the efficiency and economics of digital electronic components used in data centers, such as switches and processors, to make them easier and less expensive to produce while at the same time accommodating higher bandwidth requirements.

BRIEF SUMMARY

Embodiments of the invention described herein therefore provide improved printed circuit board assemblies that are configured to facilitate communication between digital electronic components such as processors and switches, while at the same time allowing for higher bandwidth transmissions by implementing an integral radio frequency waveguide within the layers of the printed circuit board so as to decrease the amount of copper needed in the printed circuit board and reduce the size of the printed circuit board assembly, thereby increasing the full density of the printed circuit board assembly, while saving power and allowing higher total bandwidth.

Accordingly, in some embodiments, a printed circuit board assembly for a high-speed, short-reach communication link is provided that includes a printed circuit board comprising a plurality of layers and a digital electronic component supported by the printed circuit board, wherein the digital electronic component is configured to convert between electrical signals and radio frequency signals, and wherein at least one of the plurality of layers defines a channel configured to confine radio frequency waves therein. The assembly further includes a radio frequency antenna in communication with the digital electronic component and with the channel, wherein the radio frequency antenna is configured to transmit radio frequency signals generated by the digital electronic component into the channel as radio frequency waves or to receive radio frequency waves via the channel and convey corresponding radio frequency signals to the digital electronic component.

In some cases, the channel may comprise conductive walls surrounding a dielectric material configured to propagate the radio frequency waves therethrough. In other cases, the channel may comprise conductive walls surrounding a hollow center configured to propagate the radio frequency waves therethrough. The antenna may, in some embodiments, extend into the channel, whereas in other embodiments the antenna may be disposed in a substrate of the digital electronic component and the radio frequency waves may be propagated to the channel using metallic VIAs. The channel may be rectangular in cross-section. The radio frequency waves may be millimeter waves.

In some embodiments, the channel may extend from the digital electronic component to an edge of the printed circuit board. In some cases, the printed circuit board assembly may further comprise a connector proximate the edge of the printed circuit board. The channel may be configured to transmit the radio frequency waves between the digital electronic component and the connector, and the connector may be configured to pass the radio frequency waves between the printed circuit board assembly and a second printed circuit board assembly. In other cases, the printed circuit board assembly may further comprise a plastic waveguide in communication with the channel. The channel may be configured to transmit the radio frequency waves between the digital electronic component and the plastic waveguide, and the plastic waveguide may be configured to pass the radio frequency waves between the printed circuit board assembly and a second printed circuit board assembly.

In some cases, the digital electronic component may be a first digital electronic component, and the printed circuit board assembly may further comprise a second digital electronic component supported by the printed circuit board, where the channel extends between the first digital electronic component and the second digital electronic component.

The digital electronic component may comprise a component selected from the group consisting of a processor, a switch, a network interface card (NIC), a microcontroller, a driver, and a transimpedance amplifier (TIA).

In some cases, at least two of the plurality of layers may define channels configured to confine radio frequency waves therein, and a radio frequency antenna in communication with the digital electronic component may extends into each respective channel. Each radio frequency antenna may be configured to transmit radio frequency signals generated by the digital electronic component into the respective channel as radio frequency waves or to receive radio frequency waves via the respective channel and convey corresponding radio frequency signals to the digital electronic component. The channels defined in a first layer of the printed circuit board may be staggered with respect to channels defined in a second layer of the printed circuit board.

In other embodiments, a method of assembling a printed circuit board assembly for a high-speed, short-reach communication link is provided. The method comprises forming a printed circuit board comprising a plurality of layers, wherein forming the printed circuit board comprises defining a channel in at least one of the plurality of layers, and wherein the channel is configured to confine radio frequency waves therein. The method further comprises disposing a digital electronic component on the printed circuit board, wherein the digital electronic component is configured to convert between electrical signals and radio frequency signals, and forming a radio frequency antenna in communication with the digital electronic component and with the channel. The antenna is configured to transmit radio frequency signals generated by the digital electronic component into the channel as radio frequency waves or to receive radio frequency waves via the channel and convey corresponding radio frequency signals to the digital electronic component.

In some cases, defining the channel may comprise surrounding a dielectric material with conductive walls, whereas in other cases defining the channel may comprise surrounding a hollow center with conductive walls.

Defining the channel may comprise defining the channel from the digital electronic component to an edge of the printed circuit board, and the method may further comprise disposing a connector proximate the edge of the printed circuit board, wherein the channel is configured to transmit the radio frequency waves between the digital electronic component and the connector and wherein the connector is configured to pass the radio frequency waves between the printed circuit board assembly and a second printed circuit board assembly.

In some cases, defining the channel may comprise defining the channel from the digital electronic component to an edge of the printed circuit board, and the method may further comprise disposing a plastic waveguide in communication with the channel, wherein the channel is configured to transmit the radio frequency waves between the digital electronic component and the plastic waveguide and wherein the plastic waveguide is configured to pass the radio frequency waves between the printed circuit board assembly and a second printed circuit board assembly.

In still other cases, the digital electronic component may be a first digital electronic component, and the method may further comprise disposing a second digital electronic component on the printed circuit board and defining the channel between the first digital electronic component and the second digital electronic component.

In some embodiments, the method may further comprise defining channels in at least two of the plurality of layers and extending a radio frequency antenna into each respective channel, wherein each radio frequency antenna is configured to transmit radio frequency signals generated by the digital electronic component into the respective channel as radio frequency waves or to receive radio frequency waves via the respective channel and convey corresponding radio frequency signals to the digital electronic component. Defining the channels may comprise defining channels in a first layer of the printed circuit board that are staggered with respect to channels defined in a second layer of the printed circuit board.

BRIEF DESCRIPTION OF THE SEVERAL VIEWS OF THE DRAWING(S)

Having thus described the disclosure in general terms, reference will now be made to the accompanying drawings, which are not necessarily drawn to scale, and wherein:

DETAILED DESCRIPTION OF THE DRAWINGS

The present invention now will be described more fully hereinafter with reference to the accompanying drawings in which some but not all embodiments of the inventions are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout. Depictions of the printed circuit board assembly and components thereof are simplified for ease of explanation.

Various components in a data center, such as switches and processors, may be configured to communicate with each other to accomplish the transmission and routing of data from a source to a destination. In conventional scenarios, for example, conductor-based electrical interconnects have been used for such transmissions in wireline communication systems. Such systems, however, are limited in channel bandwidth due to the effects of electromagnetic induction.

As an alternative, other conventional systems have relied on optical interconnects to transmit optical signals across short distances (e.g., within the datacenter), such as via optical cables. Such systems come with their own challenges, however, as the costs associated with electro-optical components can be high due to the low tolerances and high accuracy required of the components, as well as for other reasons.

Still other conventional systems have used metal waveguides to transmit radio frequency (RF) waves between components over short distances. Metal waveguides comprise hollow metal tubes, and the RF waves are propagated through the tubes using air as the dielectric. Some of the shortcomings of metal waveguides are caused by its high rigidity, which makes the waveguides expensive and inconvenient to implement.

More recently, waveguides known as "plastic straw" or "e-tubes" have been used to transmit RF waves in high-speed, short-reach communication links. Plastic straw has been promoted as reducing the costs associated with such transmissions, while avoiding the negative effects of conductor-based interconnects. Plastic straw refers to a dielectric waveguide clad with a thin metal layer that achieves nearly 20-GHz bandwidth over the V band (approximately 70 GHz) and exhibits a frequency-independent insertion loss of 4 dB/m. Such waveguides are touted by some as overcoming the deficiencies of both conductor-based interconnects and optical interconnects, achieving two-times data throughput with minimal to no physical overhead when compared with conventional RF communication technology, as well as providing greater flexibility and manufacturability when compared to metal waveguides.

Figure 1:
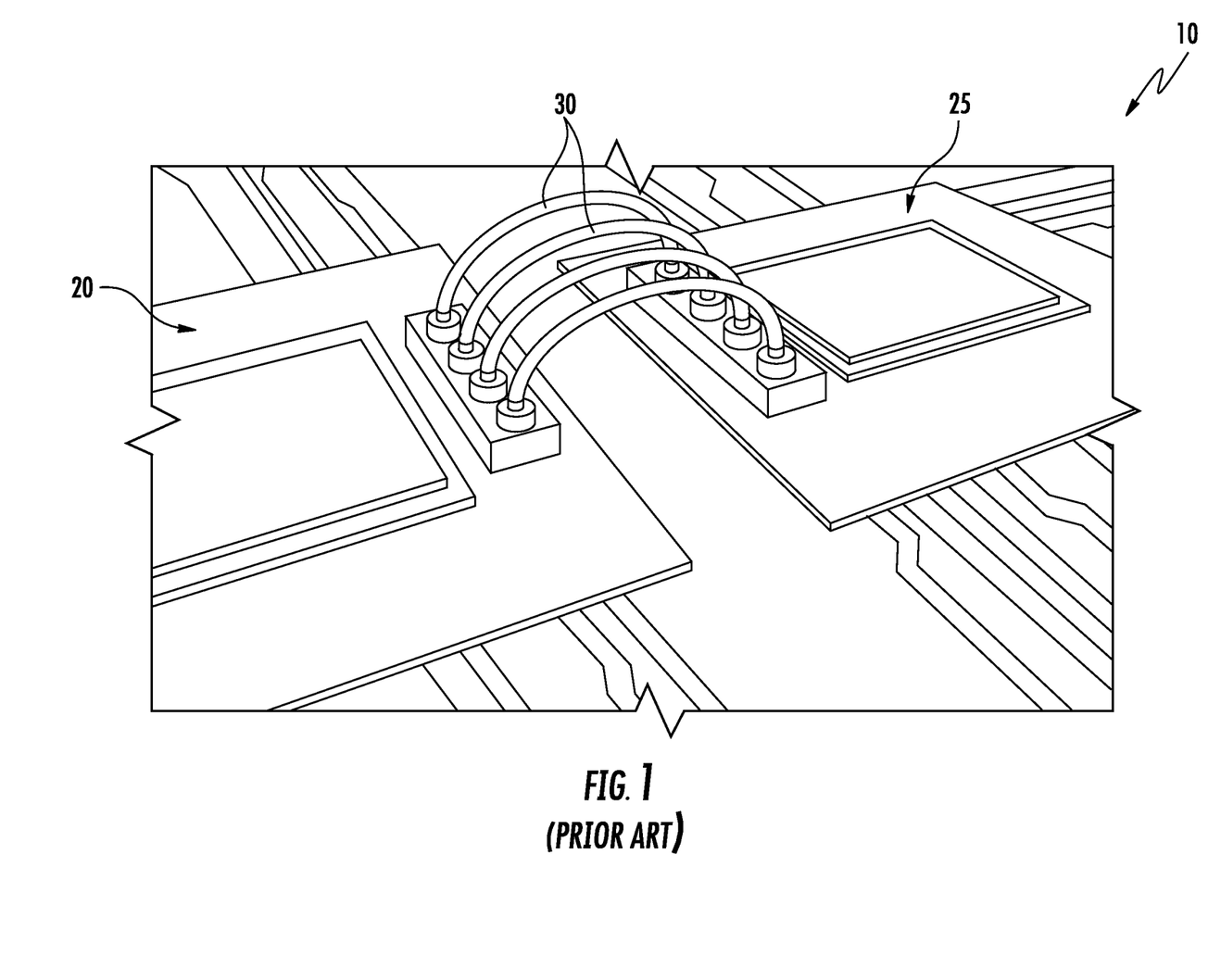
FIG. 1 is a perspective view of a plastic straw interface between two conventionally configured printed circuit board (PCB) assemblies.

A conventional plastic straw interface 10 between two printed circuit board (PCB) assemblies 20, 25 is shown in FIG. 1. As illustrated, however, the structure of the plastic straws 30 through which the RF waves are propagated is such that space (e.g., volume) is required to enable the physical connections to be made between the two PCB assemblies 20, 25.

Through hard work and applied ingenuity, the inventors have discovered new techniques for transmitting signals in high-speed, short-reach communication links without consuming the valuable, limited space surrounding the PCB assemblies in wireless fashion. In particular, embodiments of the invention described herein provide for PCB assemblies in which the PCB includes one or more specific layers that define integral waveguides for transmitting high bandwidth signals between digital electronic components, where the components are supported by the same PCB or on different PCBs. As described in greater detail below, such signals may be RF, wireless, or millimeter wave transmissions.

Figure 2:
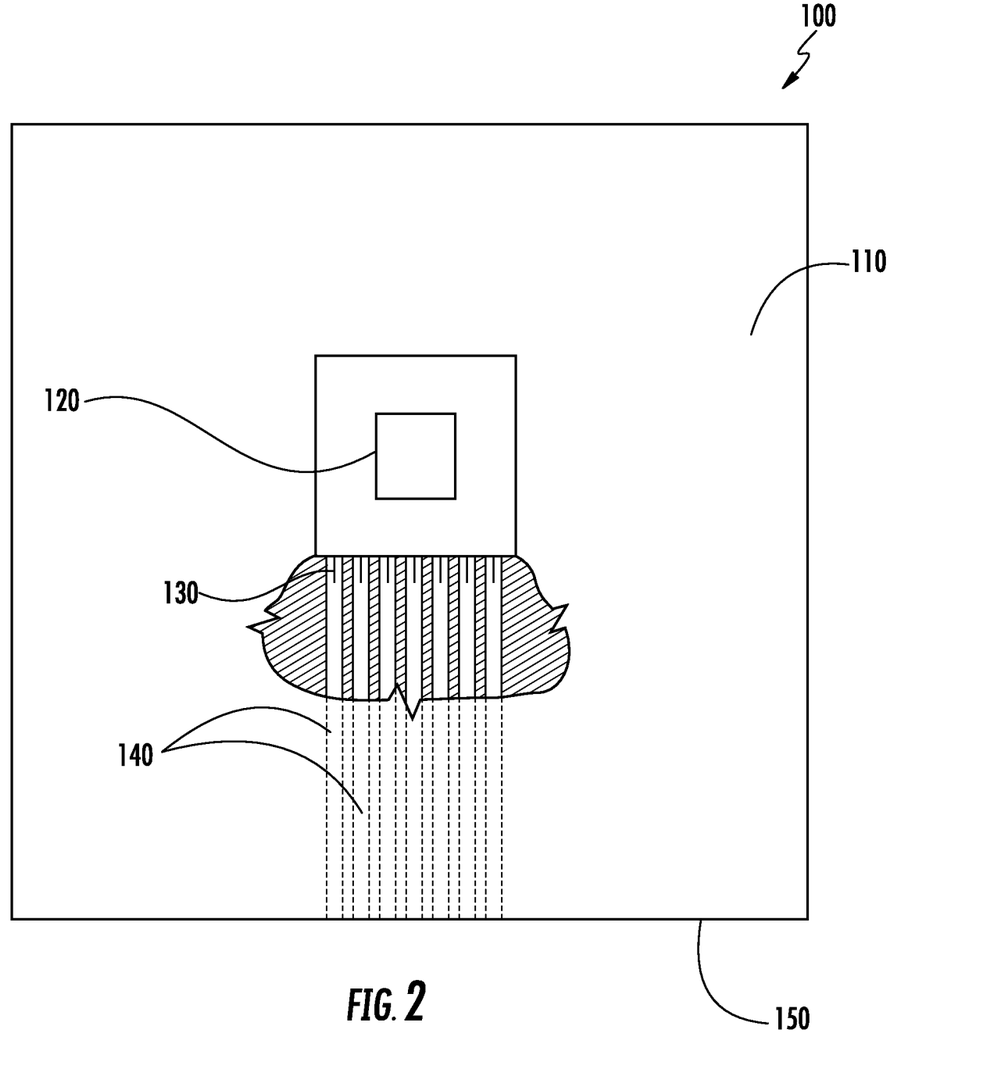
FIG. 2 is a top view of a PCB assembly with integrally defined channels according to an example embodiment.
Figure 3:
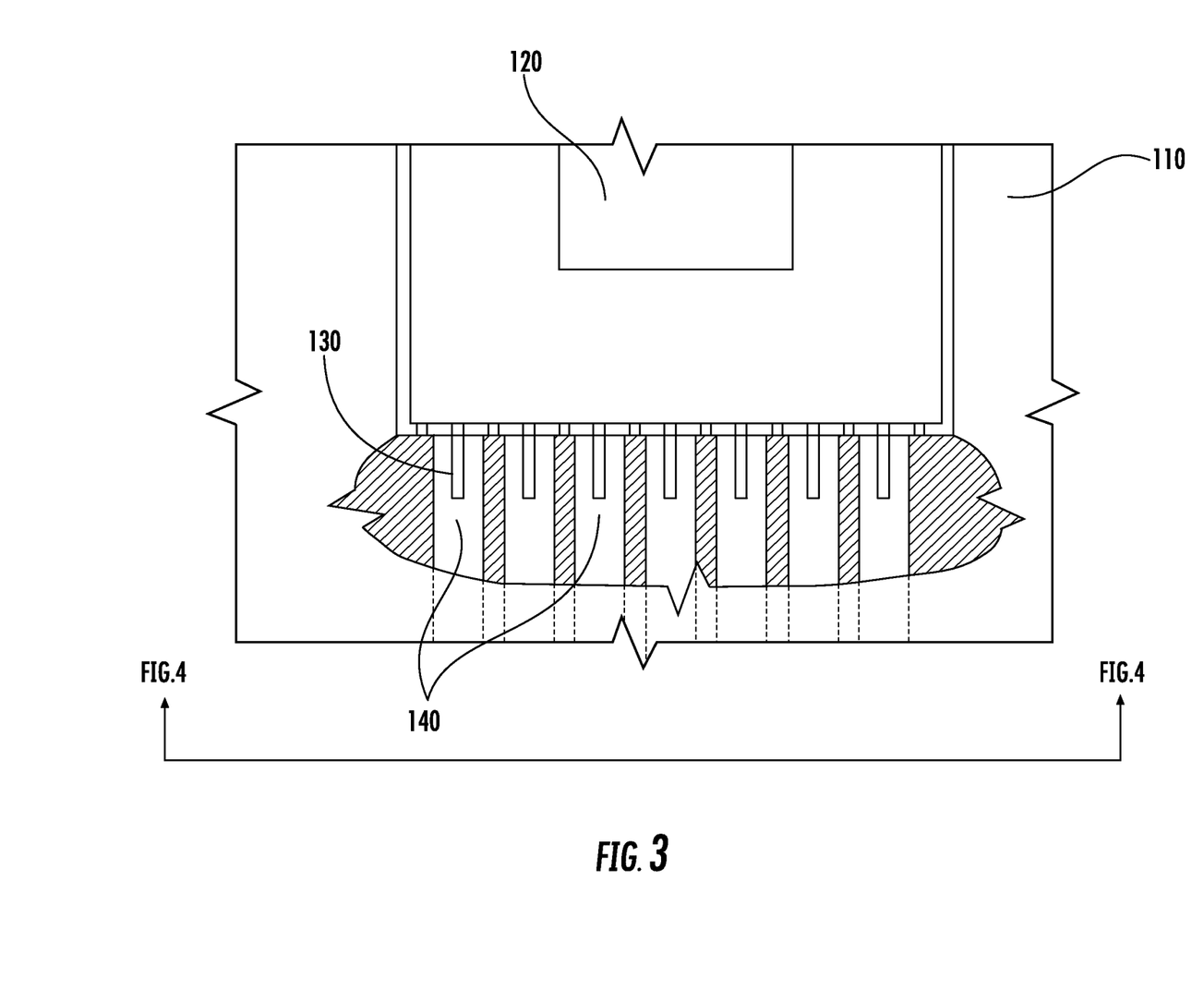
FIG. 3 is a close-up view of the PCB assembly of FIG. 2 according to an example embodiment.
Figure 4:
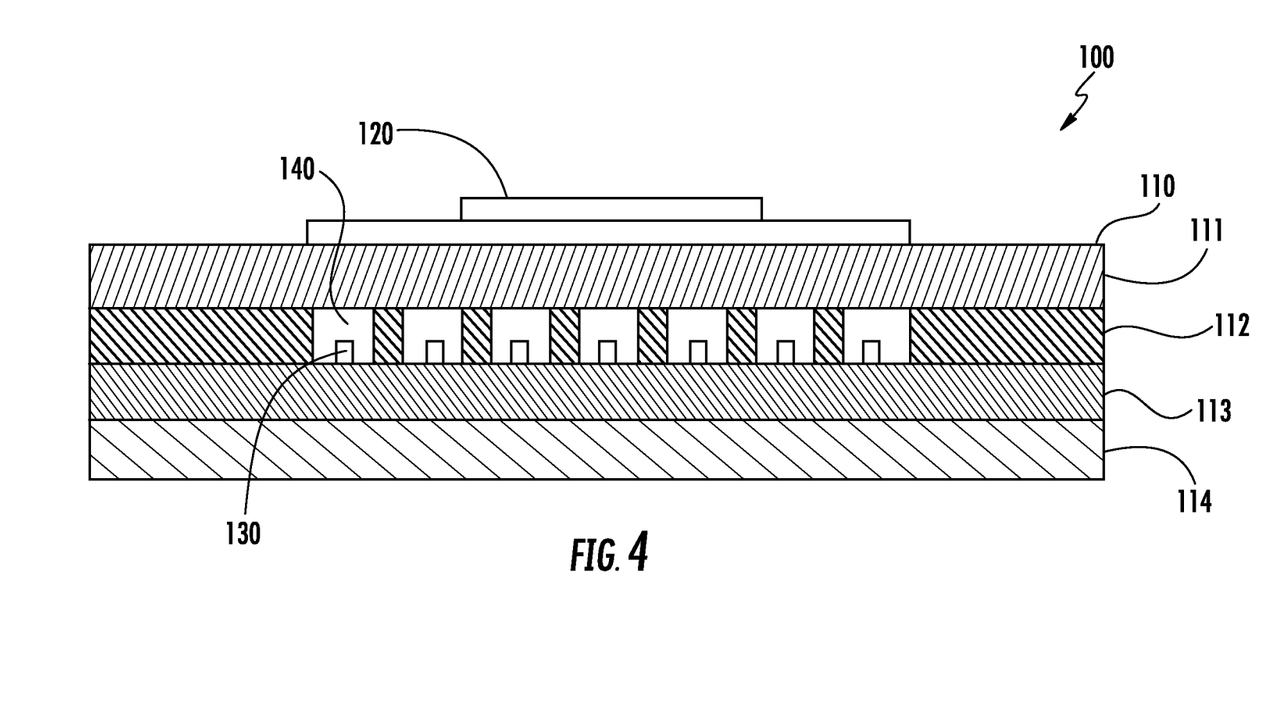
FIG. 4 is a cross-sectional view of the PCB assembly of FIG. 3 according to an example embodiment.

With reference now to FIGS. 2-4, a wireless PCB assembly 100 for a high-speed, short-reach communication link is shown. As used herein, the term "high-speed" refers to a speed of approximately 25 Gb/s to 100 Gb/s or more, and the term "short-reach" refers to distances between components within a rack, such as defined by OIF standards (e.g., USR/VSR/XSR/MR applications), as would be understood by one skilled in the art in view of this disclosure. The PCB assembly 100 may comprise a PCB 110 comprising a plurality of layers 111, 112, 113, 114, a digital electronic component 120 supported by the PCB 110, and an RF antenna 130 in communication with the digital electronic component. In this regard, the digital electronic component 120 may be configured to convert between electrical signals and RF signals, and the RF antenna 130 may be configured to transmit the RF signals generated by the digital electronic component as RF waves (e.g., as millimeter wave transmissions).

As shown in FIG. 3, at least one of the plurality of layers 112 of the PCB 110 may define a channel 140 that is configured to confine RF waves therein. Thus, the channel 140 may be considered an RF waveguide that is integrally formed within at least one of the layers 112 of the PCB 110. For example, in the depicted embodiment, the PCB 110 has four layers 111, 112, 113, 114, and the channels 140 (seven channels shown) are defined in the second layer 112. In other embodiments, however, a lesser or greater number of layers may define the PCB 110, such as six layers. Moreover, although the depicted embodiment of FIGS. 2-4 shows seven channels 140, a lesser or greater number of channels may be provided in the selected layer, such as a single channel up to twelve or more channels. Although the channels 140 are shown defined in the second layer 112 in the depicted embodiment, the channels 140 may be defined in any of the layers of the PCB that are between the outer layers 111, 114.

In some embodiments, the channel 140 may comprise conductive walls surrounding a hollow center that is configured to propagate the RF waves therethrough. For example, the channel 140 may be formed as a hollow channel having metal cladding. In some cases, the channel 140 may have walls (e.g., floor, roof, and side walls) that are plated with PCB conductive materials such as copper, nickel, or gold. In other cases, however, instead of plating, the walls of the channel 140 may include an array of via holes, which may be densely positioned on the walls, to create an RF shield.

In other embodiments, the channel 140 may comprise conductive walls surrounding a dielectric material (e.g., a low dielectric index material) that is configured to propagate the RF waves therethrough. For example, the channel 140 may be formed by depositing a PCB dielectric material, such as a MEGTRON 6 material from Matrix Circuit Board Materials for impedance matching or a standard low-cost PCB material, during the formation of the layer 112 into the channel 140 defined within the layer. A metal cladding (e.g. copper, nickel, or gold plating) may be applied to the walls of the channel so as to surround the dielectric material. In other embodiments (not shown), metallic VIAs or a lithography-defined cavity may be used to all RF waves to be propagated between the digital electronic component 120 through the adjacent layer(s) (e.g., the layer 111), and to the channel 140. In such embodiments, instead of transmitting an electrical signal from the digital electronic component 120 to the antennae 130 using traces of the PCB (e.g., from the flip chip), as in the embodiment shown in FIG. 4, the antenna 130 may be disposed (e.g., formed as part of) the substrate of the chip (e.g., within the electronic component 120 or an associated layer), such that the RF waves transmitted by the antenna 130 located in the chip substrate would be propagated into the channel 140 using the metallic VIAs or lithography-defined cavity described above. In FIG. 4, for example, the flip chip substrate is represented by the layer between the digital electronic component 120 and the layer 111. Moreover, as shown in FIG. 4, the channel 140 may be rectangular in cross-section. In other cases, however, square or (in some instances) circular cross-sections may be used, depending on the link budget requirements and manufacturing practicalities.

The digital electronic component 120 may comprise any electronic component that is configured to communicate signals in a high-speed, short-reach communication link, as will be understood by one skilled in the art in light of this disclosure. In some embodiments, for example, the PCB assembly 100 may comprise or be part of a switch system that includes a switch integrated circuit (e.g., InfiniBand® or Ethernet® switch). In such cases, the digital electronic component 120 may be a processor or a switch. In other cases, the digital electronic component 120 may be a network interface controller (NIC), a microcontroller, a driver, a transimpedance amplifier (TIA), or the like. The digital electronic component 120 may be assembled on the PCB 110 using conventional methods, such as flip chip techniques and wire bonding.

With reference to FIGS. 3 and 4, the RF antenna 130 maybe connected to an RF driver (not shown), and the RF antenna, via the RF driver, may be configured to transmit or receive an RF wave through a respective channel 140. Accordingly, the RF antenna 130 may extend into the channel 140 and may be in communication with the digital electronic component 120. In this way, the digital electronic component 120 may receive an electrical signal (e.g., from another component of the PCB assembly 100), convert the electrical signal to an RF signal, and communicate the RF signal to the RF antenna 130, which may in turn transmit the RF signal as an RF wave into the respective channel 140, via which the RF wave can be propagated to another RF antenna acting as a receiver, either on the same PCB assembly or a different PCB assembly, as described in greater detail below. Similarly, the RF antenna 130 may receive the RF wave from respective channel 140 through which it is propagating and communicate a corresponding RF signal to the digital electronic component 120, and the digital electronic component 120 may then generate an electrical signal based on the received RF signal. In the receiver scenario, the RF wave may be received into the channel 140 from another component, either on the same PCB assembly 100 or a different PCB assembly. In a preferred embodiment, for example, the RF waves may be millimeter waves.

As seen in FIG. 2, the channels 140 may, in some cases, extend from the digital electronic component 120 to an edge 150 of the printed circuit board 110. In such cases, the RF waves may be transmitted via the channel 140 between the digital electronic component 120 of the PCB assembly 100 and another digital electronic component of a different PCB assembly (such as via another channel formed in a layer of the PCB of the other PCB assembly).

For example, in some cases, the PCB assembly 100 may further comprise a connector proximate the edge 150 of the PCB. In such cases, the channel 140 may be configured to allow the RF waves to be transmitted between the digital electronic component 120 and the connector, and the connector may in turn be configured to pass the RF waves between the PCB assembly 100 and a second PCB assembly (e.g., to/from a corresponding connector disposed on a corresponding edge of the PCB of the second PCB assembly).

In other embodiments, the RF waves may be transmitted from one PCB assembly to another using a plastic waveguide. For example, the PCB assembly 100 may comprise a plastic waveguide in communication with the channel 140, and the channel may be configured to allow the RF waves to be transmitted between the digital electronic component 120 and the plastic waveguide. The plastic waveguide may, in turn, may be configured to pass the RF waves between the PCB assembly 100 and a second PCB assembly (e.g., by connecting at one end of the plastic waveguide to the channel 140 of the first PCB assembly 100 and at the other end of the plastic waveguide to a corresponding channel of the second PCB assembly).

Figure 5:
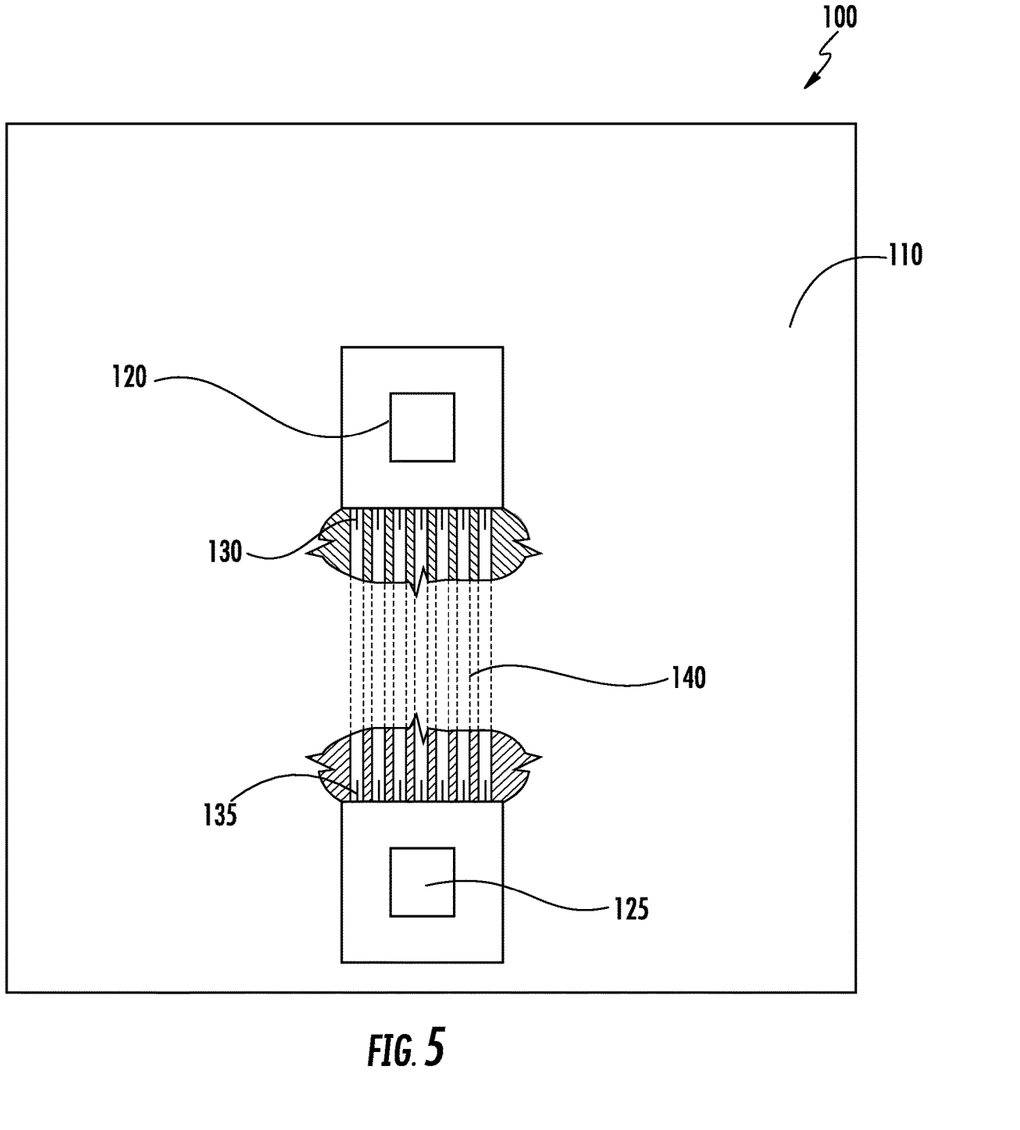
FIG. 5 is a top view of a PCB assembly with two digital electronic components and integrally defined channels extending therebetween according to an example embodiment.

In some cases, rather than transmitting RF waves between digital electronic components on two different PCB assemblies, the digital electronic components between which RF waves are passed may be supported by the same PCB (e.g., as components of the same PCB assembly). For example, with reference to FIG. 5, the digital electronic component 120 may be a first digital electronic component, and the PCB assembly 100 may further comprise a second digital electronic component 125 supported by the PCB 110. In this case, the channel 140 may extend between the first digital electronic component 120 and the second digital electronic component 125 and may be configured to pass RF waves between an RF antenna 130 at one end of the channel 140 (in communication with the first digital electronic component 120) and an RF antenna 135 at the other end of the channel 145 (in communication with the second digital electronic component 125).

Figure 6:
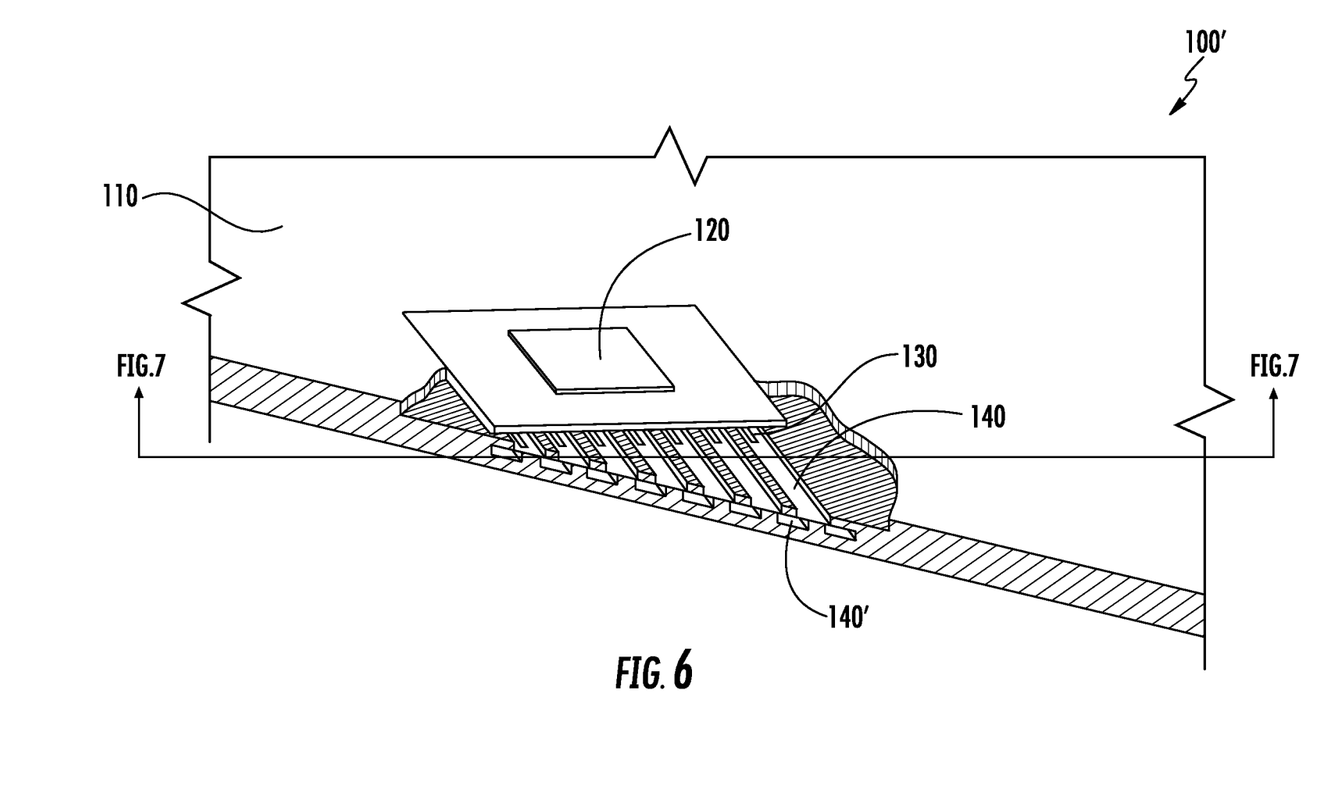
FIG. 6 is a perspective view of a PCB assembly with channels defined in a staggered configuration in two layers of the PCB according to an example embodiment.
Figure 7:
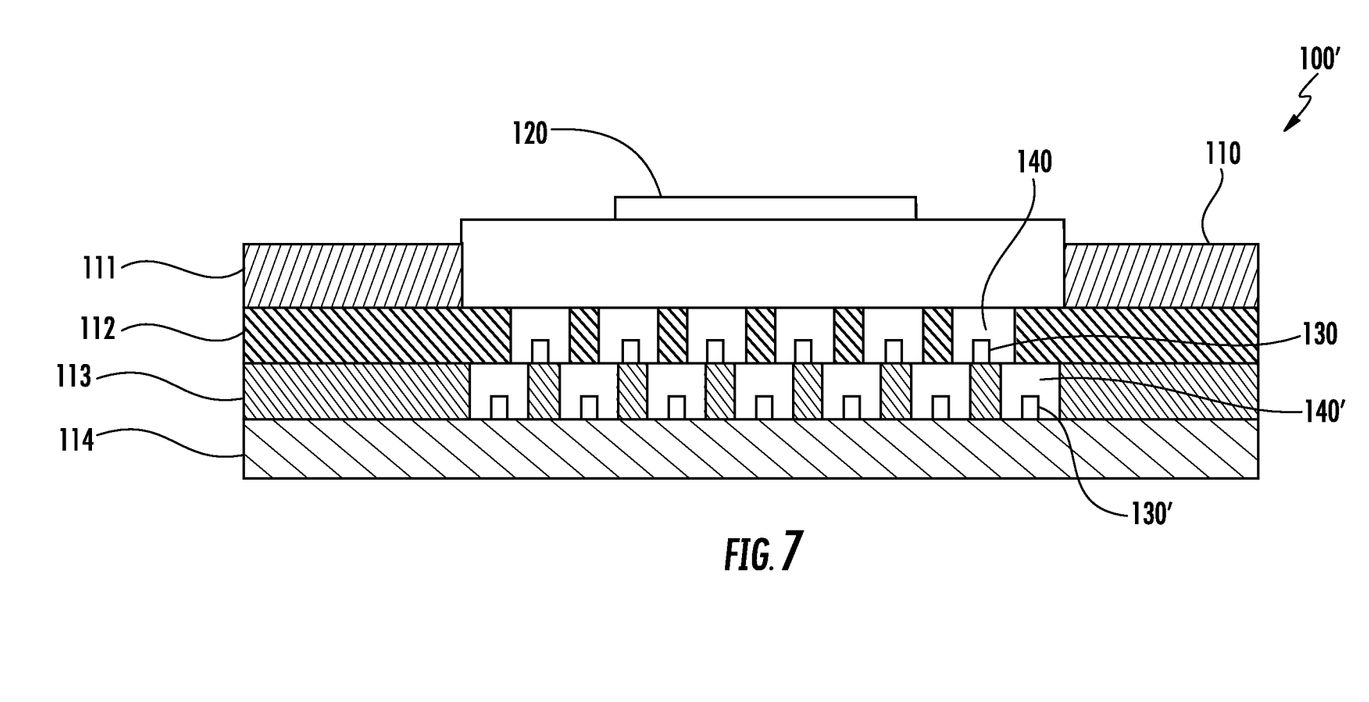
FIG. 7 is a cross-sectional view of the PCB assembly of FIG. 6 according to an example embodiment.

Although in FIGS. 2-5 embodiments of the PCB assembly are shown in which a single layer 112 of the plurality of layers 111, 112, 113, 114 defines the channel(s) 140, in other embodiments, such as shown in FIGS. 6 and 7, the channels 140 are defined in more than one layer of the PCB. For example, in some embodiments, at least two of the plurality of layers (e.g., layers 112, 113 in FIG. 7) may define channels 140, 140' that are configured to confine RF waves therein. Accordingly, an RF antenna 130, 130' in communication with the digital electronic component 120 may extend into each respective channel 140, 140', and each RF antenna may be configured to transmit RF signals generated by the digital electronic component into the respective channel as RF waves or to receive RF waves via the respective channel and convey corresponding RF signals to the digital electronic component.

In such embodiments, channels 140, 140' defined in different layers 112, 113 may be staggered with respect to each other, such that adjacent layers may be used to define the channels without compromising the structural integrity of the PCB, and at the same time reducing the area requirements of the PCB and its components and maximizing the efficient use of space on the PCB. Thus, as shown in FIG. 6 (in which an outermost layer of the PCB is removed for purposes of explanation) and in FIG. 7, channels 140 defined in a first layer 112 of the PCB may be staggered with respect to channels 140' defined in a second layer 113 of the PCB. For example, six channels 140 may be defined in the first layer 112, and seven channels 140' may be defined in the second layer 113, with the six channels of the first layer disposed between corresponding adjacent channels of the second layer, as shown. As described above with respect to the embodiments of FIGS. 2-5, the channels 140, 140' may nevertheless extend to the edge of the PCB in some embodiments, while in other embodiments the channels may extend between digital electronic components supported by the same PCB. Moreover, connectors and plastic waveguides may be used in conjunction with the embodiments described in FIGS. 6 and 7, similar to the way in which they are used in connection with the embodiments of FIGS. 2-4 described above.

Figure 8:
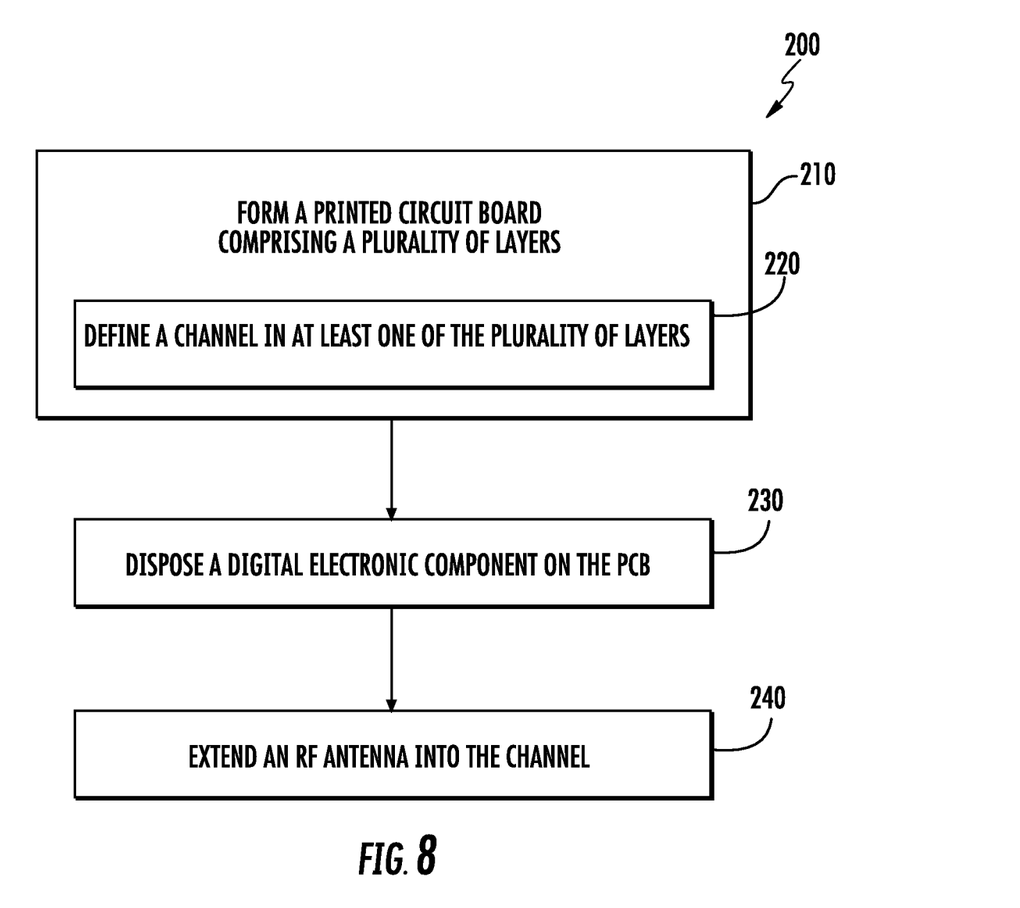
FIG. 8 is a flow chart depicting a method of assembling a PCB assembly having a channel integrally defined in a layer of the PCB according to an example embodiment.

With reference now to FIG. 8, in some embodiments, a method 200 of assembling a printed circuit board assembly for a high-speed, short-reach communication link is provided. The method comprises forming a printed circuit board comprising a plurality of layers at Block 210. Forming the printed circuit board may include defining a channel in at least one of the plurality of layers at Block 220, where the channel is configured to confine RF waves therein, as described above.

A digital electronic component may be disposed on the PCB at Block 230. The digital electronic component may be configured to convert between electrical signals and RF signals. Furthermore, an RF antenna may be extended into the channel at Block 240. As described above, the RF antenna may be in communication with the digital electronic component and may be configured to transmit RF signals generated by the digital electronic component into the channel as RF waves or to receive RF waves via the channel and convey corresponding RF signals to the digital electronic component.

In some cases, defining the channel may comprise surrounding a dielectric material with conductive walls, such as by plating the walls with a PCB conductor, as described above. Similarly, defining the channel may comprise surrounding a hollow center with conductive walls.

In some embodiments, defining the channel may comprise defining the channel from the digital electronic component to an edge of the printed circuit board. In such cases, the method may further include disposing a connector proximate the edge of the PCB. The channel may be configured to transmit the RF waves between the digital electronic component and the connector, and the connector may be configured to pass the RF waves between the PCB assembly and a second PCB assembly.

As described above, defining the channel may comprise defining the channel from the digital electronic component to an edge of the printed circuit board, and the method may further comprise disposing a plastic waveguide in communication with the channel, where the channel is configured to transmit the RF waves between the digital electronic component and the plastic waveguide, and where the plastic waveguide is configured to pass the RF waves between the PCB assembly and a second PCB assembly.

In still other cases, the digital electronic component may be a first digital electronic component, and the method may further include disposing a second digital electronic component on the PCB and defining the channel between the first digital electronic component and the second digital electronic component.

In some embodiments, as described above, the method may include defining channels in at least two of the plurality of layers and extending an RF antenna into each respective channel. Each RF antenna may be configured to transmit RF signals generated by the digital electronic component into the respective channel as RF waves or to receive RF waves via the respective channel and convey corresponding RF signals to the digital electronic component. In such cases, defining the channels may comprise defining channels in a first layer of the PCB that are staggered with respect to channels defined in a second layer of the PCB.

Many modifications and other embodiments of the inventions set forth herein will come to mind to one skilled in the art to which these inventions pertain having the benefit of the teachings presented in the foregoing descriptions and the associated drawings. Although the figures only show certain components of the apparatus and systems described herein, it is understood that various other components (e.g., components that would normally be mounted on the PCB assembly) may also be part of the communication link described above. Therefore, it is to be understood that the inventions are not to be limited to the specific embodiments disclosed and that modifications and other embodiments are intended to be included within the scope of the appended claims. Moreover, the steps in the method 200 described above may not necessarily occur in the order depicted in FIG. 8, and in some cases one or more of the steps depicted in Blocks 210-240 may occur substantially simultaneously. Although specific terms are employed herein, they are used in a generic and descriptive sense only and not for purposes of limitation.

What is claimed is:

1. A printed circuit board assembly for a high-speed, short-reach communication link, the assembly comprising:
   a printed circuit board comprising a plurality of layers;
   a digital electronic component supported by the printed circuit board, wherein the digital electronic component is configured to convert between electrical signals and radio frequency signals, wherein each of at least two of the plurality of layers defines an array of channels, each channel configured to confine radio frequency waves therein; and
   a radio frequency antenna disposed in each channel, wherein each radio frequency antenna is in communication with the digital electronic component and with the respective channel, wherein each radio frequency antenna is configured to transmit radio frequency signals generated by the digital electronic component into the respective channel as radio frequency waves or to receive radio frequency waves via the respective channel and convey corresponding radio frequency signals to the digital electronic component.

2. The printed circuit board assembly of claim 1, wherein the channel comprises conductive walls surrounding a dielectric material configured to propagate the radio frequency waves therethrough.

3. The printed circuit board assembly of claim 1, wherein the channel comprises conductive walls surrounding a hollow center configured to propagate the radio frequency waves therethrough.

4. The printed circuit board assembly of claim 1, wherein the antenna extends into the channel.

5. The printed circuit board assembly of claim 1, wherein the antenna is disposed in a substrate of the digital electronic component, wherein the radio frequency waves are propagated to the channel using metallic VIAs.

6. The printed circuit board assembly of claim 1, wherein the channel extends from the digital electronic component to an edge of the printed circuit board.

7. The printed circuit board assembly of claim 6 further comprising a connector proximate the edge of the printed circuit board, wherein the channel is configured to transmit the radio frequency waves between the digital electronic component and the connector and wherein the connector is configured to pass the radio frequency waves between the printed circuit board assembly and a second printed circuit board assembly.

8. The printed circuit board assembly of claim 6 further comprising a plastic waveguide in communication with the channel, wherein the channel is configured to transmit the radio frequency waves between the digital electronic component and the plastic waveguide and wherein the plastic waveguide is configured to pass the radio frequency waves between the printed circuit board assembly and a second printed circuit board assembly.

9. The printed circuit board assembly of claim 1, wherein the digital electronic component is a first digital electronic component, the printed circuit board assembly further comprising a second digital electronic component supported by the printed circuit board, wherein the channel extends between the first digital electronic component and the second digital electronic component.

10. The printed circuit board assembly of claim 1, wherein the digital electronic component comprises a component selected from the group consisting of a processor, a switch, a network interface card (NIC), a microcontroller, a driver, and a transimpedance amplifier (TIA).

11. The printed circuit board assembly of claim 1, wherein channels defined in a first layer of the printed circuit board are staggered with respect to channels defined in a second layer of the printed circuit board.

12. A method of assembling a printed circuit board assembly for a high-speed, short-reach communication link, the method comprising: forming a printed circuit board comprising a plurality of layers, wherein forming the printed circuit board comprises defining an array of channels in each of at least two of the plurality of layers, and wherein each channel is configured to confine radio frequency waves therein; disposing a digital electronic component on the printed circuit board, wherein the digital electronic component is configured to convert between electrical signals and radio frequency signals; and forming a radio frequency antenna in each channel, wherein each radio frequency antenna is in communication with the digital electronic component, wherein each antenna is configured to transmit radio frequency signals generated by the digital electronic component into the respective channel as radio frequency waves or to receive radio frequency waves via the respective channel and convey corresponding radio frequency signals to the digital electronic component.

13. The method of claim 12, wherein defining the channel comprises surrounding a dielectric material with conductive walls.

14. The method of claim 12, wherein defining the channel comprises surrounding a hollow center with conductive walls.

15. The method of claim 12, wherein defining the channel comprises defining the channel from the digital electronic component to an edge of the printed circuit board, the method further comprising disposing a connector proximate the edge of the printed circuit board, wherein the channel is configured to transmit the radio frequency waves between the digital electronic component and the connector and wherein the connector is configured to pass the radio frequency waves between the printed circuit board assembly and a second printed circuit board assembly.

16. The method of claim 12, wherein defining the channel comprises defining the channel from the digital electronic component to an edge of the printed circuit board, the method further comprising disposing a plastic waveguide in communication with the channel, wherein the channel is configured to transmit the radio frequency waves between the digital electronic component and the plastic waveguide and wherein the plastic waveguide is configured to pass the radio frequency waves between the printed circuit board assembly and a second printed circuit board assembly.

17. The method of claim 12, wherein the digital electronic component is a first digital electronic component, the method further comprising disposing a second digital electronic component on the printed circuit board and defining the channel between the first digital electronic component and the second digital electronic component.

18. The method of claim 12, wherein defining the channels comprises defining channels in a first layer of the printed circuit board that are staggered with respect to channels defined in a second layer of the printed circuit board.

* * * * *